United States Patent [19]

Okano

[11] Patent Number: 5,159,537
[45] Date of Patent: Oct. 27, 1992

[54] MOUNTING STRUCTURE FOR ELECTRONIC APPARATUS

[75] Inventor: Masayuki Okano, Kanagawa, Japan

[73] Assignee: Canon Kabushiki Kaisha, Tokyo, Japan

[21] Appl. No.: 530,618

[22] Filed: May 30, 1990

[30] Foreign Application Priority Data

Jun. 2, 1989 [JP] Japan .................. 1-140790

[51] Int. Cl.$^5$ .............................................. H05K 9/00
[52] U.S. Cl. ................... 361/424; 174/35 R; 174/35 MS; 174/35 TS
[58] Field of Search ........... 174/35 R, 35 MS, 35 TS; 361/424, 380, 392, 395, 397, 399, 400, 401, 403, 412, 413, 415; 219/10.55 R, 10.55 D; 330/68; 331/67, 68; 455/300, 301

[56] References Cited

U.S. PATENT DOCUMENTS

| | | | |
|---|---|---|---|
| 4,325,103 | 4/1982 | Ito et al. ........................... | 361/424 |
| 4,370,515 | 1/1983 | Donaldson ........................ | 174/35 R |
| 4,626,963 | 12/1986 | Speer ................................ | 361/424 |
| 4,685,034 | 8/1987 | Tetsu et al. ...................... | 361/424 |
| 4,697,044 | 9/1987 | Ishikawa ........................... | 174/35 R |
| 4,833,276 | 5/1989 | Ito . | |
| 4,882,550 | 11/1989 | Baba . | |
| 4,890,199 | 12/1989 | Beutler ............................. | 361/424 |
| 4,948,923 | 8/1990 | Suzuki .............................. | 174/35 R |

FOREIGN PATENT DOCUMENTS 3520531 12/1986 Fed. Rep. of Germany .... 174/35 R

*Primary Examiner*—Leo P. Picard
*Assistant Examiner*—Bot Lee Ledynh
*Attorney, Agent, or Firm*—Fitzpatrick, Cella, Harper & Scinto

[57] ABSTRACT

A mounting structure in which an electronic apparatus unit housed in a shield case is anchored directly on a circuit board in fixedly secured relation by fastening part of the shield case thereto. A space is created between the circuit board and a bottom plate of the shield case and part of the shield case which encloses the outer periphery of the electronic apparatus unit extends below the bottom plate to abut the circuit board and fixedly secure the shield case to the circuit board.

3 Claims, 3 Drawing Sheets

MOUNTING STRUCTURE FOR ELECTRONIC APPARATUS

BACKGROUND OF THE INVENTION

1. Field of the Invention

This invention relates to a mounting structure for an electronic apparatus wherein an electronic apparatus unit housed in a shield case is directly anchored to a circuit board.

2. Description of the Related Art

The conventional method of anchoring the electronic apparatus unit housed in the shield case directly to the circuit board is attained, for example, by such a structure as shown in FIG. 4. That is, a shield case 12 is mounted on a circuit board 11 through an insulating member 10. An electronic apparatus unit 13 that has to be shielded is placed in the interior of the shield case 12. This electronic apparatus unit 13 has a base plate $13_1$, a number of mounted parts 14 placed on the base plate $13_1$ and input/output terminals 15. If, on the circuit board 11, there are other mounted parts 16 which also have to be shielded, an additional shield case 19 must be used. On the reverse side of the circuit board 11, too, other mounted parts 17 are placed. As will be seen from the foregoing, according to the prior art, anchoring of the shield case 12 to the circuit board 11 is performed by bringing a bottom plate of the shield case 12 into close contact with the circuit board 11 either directly or through the insulating member 10. This means that a large area of the circuit board 11 which is almost equal to the size of the bottom face of the shield case 12 is used for bearing the sum of the weight of the electronic apparatus unit 13 and that of the shield case 12, so that a stable support can be performed. Further, if on one and the same circuit board 11, there are other mounted parts 16 which have to be shielded, an additional shield case 19 must be formed and mounted. This leads to a high production cost and a further increase of the area of the circuit board 11 for mounting it thereon. Thus, a problem arises that a mounting configuration of higher density is difficult to perform.

SUMMARY OF THE INVENTION

An object of the invention is to solve the above-described problem and to make it possible to realize a mounting configuration of higher density.

Another object of the invention is to make it possible to mount parts in multiple stages, while still maintaining a stable support of the shield case having an electronic apparatus unit housed therein.

Further objects of the invention will become apparent from the following description of embodiments thereof.

DETAILED DESCRIPTION OF THE PREFERRED EMBODIMENTS

Figure 1:
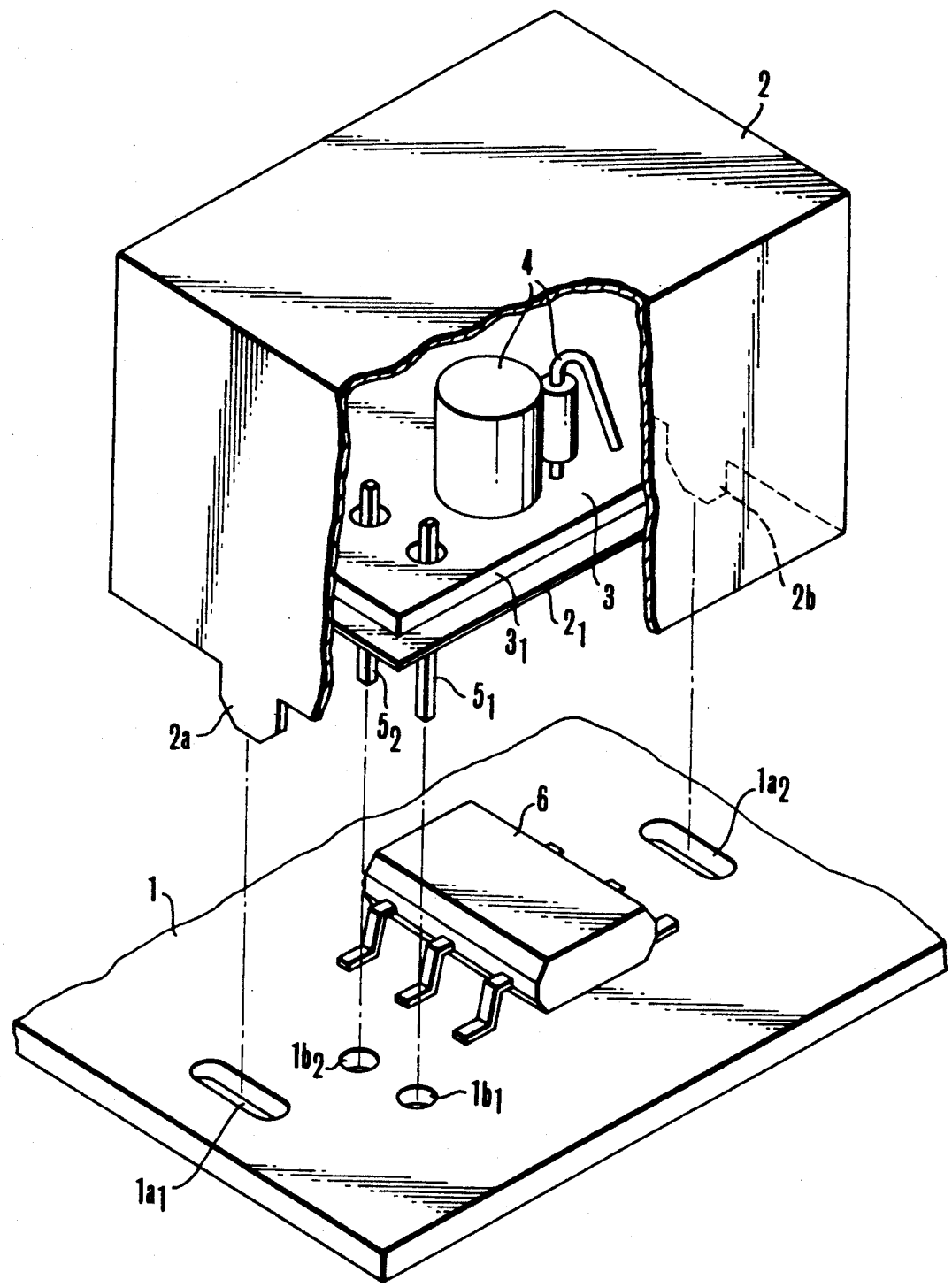
FIG. 1 is a production view of a first embodiment of a mounting structure for an electronic apparatus according to the invention with a portion broken to show the interior.
Figure 2:
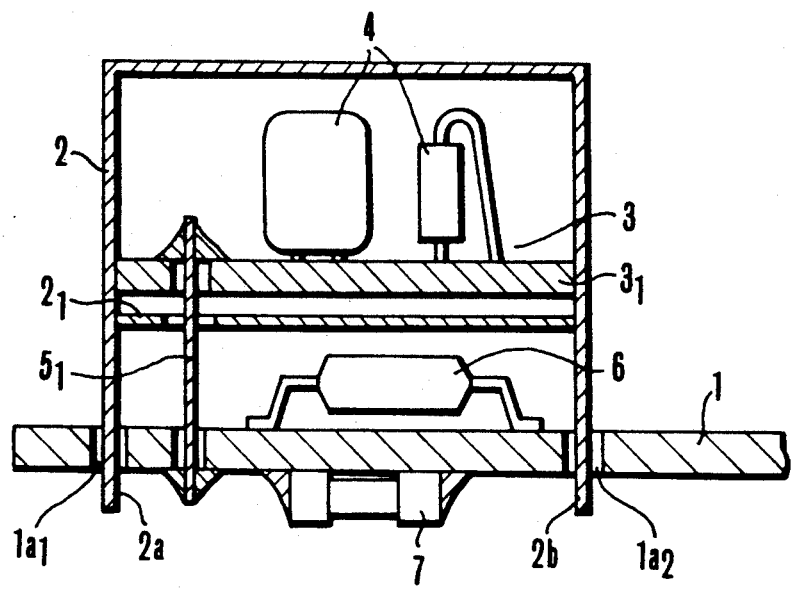
FIG. 2 is a front sectional view of the mounting structure of FIG. 1.

The present invention is next described in connection with embodiments thereof by reference to the drawings. Referring first to FIG. 1 and FIG. 2, a first embodiment of the invention is described.

In FIG. 1 and FIG. 2, a circuit board 1 for printed wirings is provided with elongated slots $1a_1$ and $1a_2$ to be used for anchoring a shield case 2 and with round holes $1b_1$ and $1b_2$ for input/output terminals $5_1$ and $5_2$ of an electronic apparatus unit 3 respectively. In the shield case 2, the electronic apparatus unit 3 which has to be shielded is housed. The bottom side of this shield case 2 is open. The open edges of the opposite two of the side walls are provided with protuberances 2a and 2b to be inserted into the aforesaid slots $1a_1$ and $1a_2$. When these protuberances 2a and 2b are fully inserted into the fitted slots $1a_1$ and $1a_2$, the open edges of the side walls of the shield case 2 come into contact with the circuit board 1, thus supporting the shield case 2. The shield case 2 has a bottom plate $2_1$ located so as to divide the interior space of the shield case 2 into an upper space and a lower space, the upper space of which is used for containing the aforesaid electronic apparatus unit 3, while the lower space is used for containing mounted parts 6 which also have to be shielded. Reference numeral 7 denotes other mounted parts placed on the reverse side of the circuit board 1.

The above-described electronic apparatus unit 3 has an electronic apparatus unit mounting base plate $3_1$, the mounted parts 4 placed on the base plate $3_1$ and the input/output terminals $5_1$ and $5_2$. These terminals $5_1$ and $5_2$ pass through respective holes of the bottom plate $2_1$ of the shield case 2 and electrically connect the wiring patterns of the mounting base plate $3_1$ with the wiring patterns of the circuit board 1.

Now, a manner in which the shield case 2 is installed on the circuit board 1 is described. At first, the mounted parts 6 which have to be shielded are mounted on the circuit board 1 by soldering, and the other mounted parts 7 are mounted on the reverse side of the circuit board 1 by soldering.

Then, the mounted parts 4 are mounted on the mounting base plate $3_1$ of the electronic apparatus unit 3 by soldering, and one end of the input/output terminals $5_1$ and $5_2$ are connected to it by soldering.

The thus-obtained electronic apparatus unit 3 having the mounted parts 4 and the input/output terminals $5_1$ and $5_2$ is inserted into the shield case 2 and seated with the base plate $3_1$ at a center of the height of the shield case 2 in a fixedly secured relation. After this, the bottom plate $2_1$ is mounted. Then, the protuberances 2a and 2b of the open edges of the shield case 2 are inserted into the slots $1a_1$ and $1a_2$ of the circuit board 1, while simultaneously inserting the other ends of the input/output terminals $5_1$ and $5_2$ into the holes $1b_1$ and $1b_2$. Then the terminals $5_1$ and $5_2$ are electrically connected to the circuit board 1 by soldering. After that, if necessary, the protuberances 2a and 2b of the open edges of the shield case 2 may be fixedly secured by soldering to the circuit board 1 at the areas where no wiring patterns exist.

By using such a mounting structure, the shield case 2 is constructed in two-stage form of the upper space and the lower space. Thus, it is made possible to achieve a great increase in the density of the mounting structure. Moreover, the stable support of the shield case 2 on the circuit board 1 can be ensured since the entire length of the open edges of the shield case 2 is in contact with the circuit board 1 and its protuberances 2a and 2b are fitted in the slots $1a_1$ and $1b_1$. This structure is to support the relatively heavy electronic apparatus unit 3.

Figure 3:
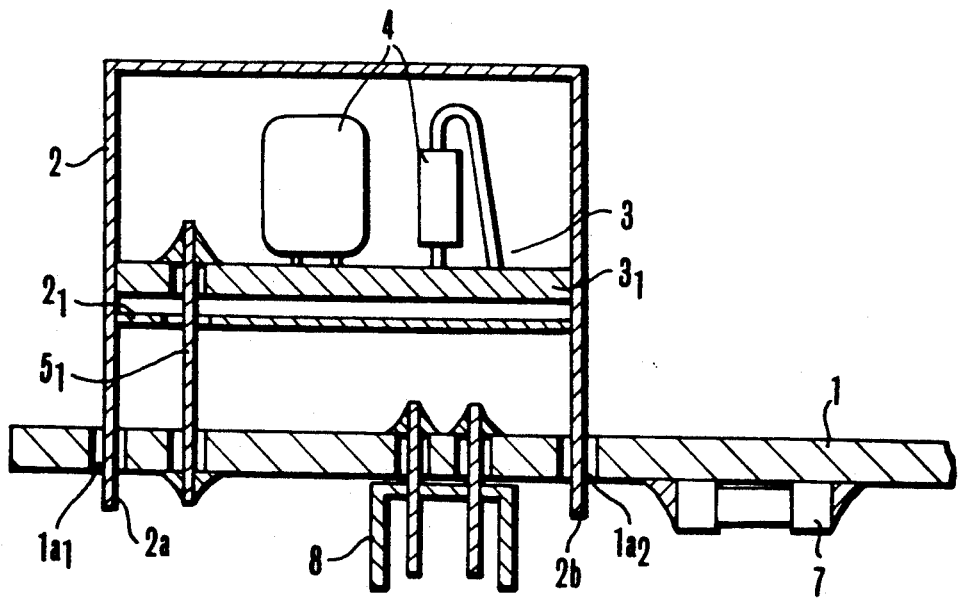
FIG. 3 is a front sectional view of a second embodiment of the mounting structure for an electronic apparatus according to the invention.
Figure 4:
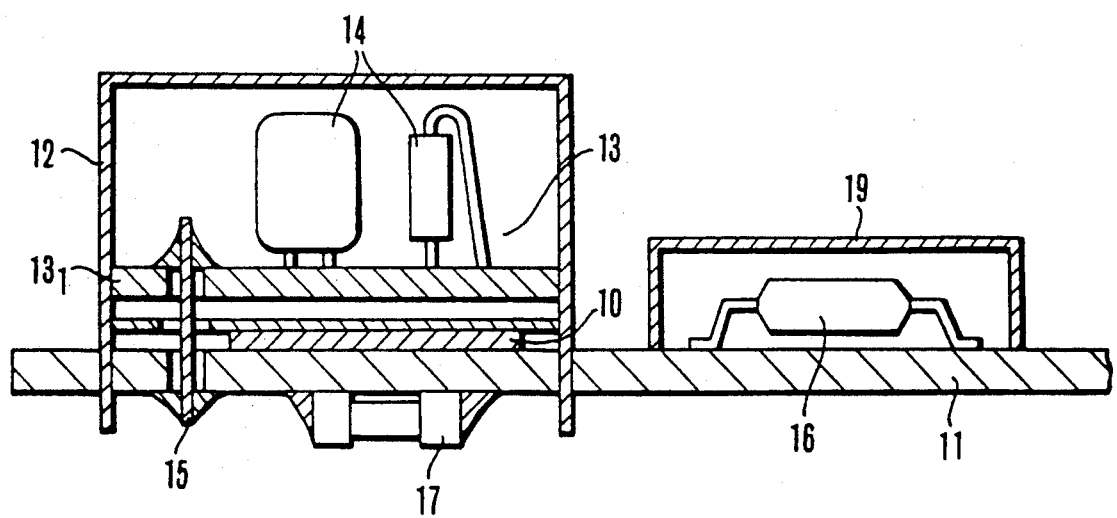
FIG. 4 is a front sectional view of the conventional mounting structure for an electronic apparatus.

FIG. 3 shows a second embodiment of the invention. In this embodiment, instead of the remaining mounted parts 7, a connector 8 is mounted on the reverse side of the circuit board 1 at the opposite location to that at which the electronic apparatus unit 3 is mounted, and its lead terminals are connected by soldering to the circuit board 1 at the location facing the lower side of the electronic apparatus unit 3.

The aforesaid connector 8 has its aim to electrically connect the circuit board 1 to another circuit board or another unit and, therefore, defines the position of receiving and transmitting signals from and to the external board or unit. Therefore, this position is very important to determine where the parts are disposed with high efficiency in order to realize a mounting structure of increased density. Therefore, to increase the degree of freedom in the layout of the mounted connector 8 is very effective to increase the density of mounting structure.

As has been described above, according to the invention, the shield case having the electronic apparatus unit housed therein is provided with a second space in between its bottom plate and the circuit board on which the electronic apparatus unit is installed. By using this second space for mounting additional parts, the area of the circuit board is effectively used with the advantage of obtaining higher density of in the mounting structure. Also since the second space is shielded, electronic parts which have to be shielded can be mounted without using another shield case as in the prior art. This produces an additional advantage of reducing the production cost.

What is claimed is:

1. A mounting structure for an electronic apparatus, comprising:
    a circuit board for printed wirings, said circuit board having fastening holes;
    a shield case forming first and second divided spaces, said shield case having protuberances on open edges thereof, wherein said protuberances are inserted into the fastening holes and said open edges are in contact with a surface of said circuit board;
    an electronic apparatus unit placed in one of the first and second divided spaces in said shield case, said electronic apparatus unit having a mounting base plate, parts mounted on said mounting base plate and input/output terminals, wherein said input/output terminals electrically connect said mounting base plate with said circuit board for printed wirings; and
    electronic parts placed in the other of the first and second divided spaces in said shield case and being shielded, said electronic parts being arranged on said circuit board surface and electrically connected to said circuit board for printed wirings, wherein
    said shield case has a bottom plate for dividing the first and second divided spaces in said shield case.

2. A mounting structure according to claim 1, wherein of the first and second divided spaces of said shield case, said electronic apparatus unit is placed in the space furtherest from said circuit board and said electronic parts are placed in the space nearest to said circuit board.

3. A mounting structure according to claim 1, wherein said circuit board has holes for electrical connection, with said input/output terminals being inserted into the holes for electrical connection and being connected by soldering.

* * * * *

UNITED STATES PATENT AND TRADEMARK OFFICE
CERTIFICATE OF CORRECTION

PATENT NO. : 5,159,537
DATED : October 27, 1992
INVENTOR(S) : Masayuki Okano

It is certified that error appears in the above-identified patent and that said Letters Patent is hereby corrected as shown below:

COLUMN 3:

Line 31, "of" (second occurrence) should be deleted.

COLUMN 4:

Line 29, "furtherest" should read --furthest--.

Signed and Sealed this

Second Day of November, 1993

Attest:

BRUCE LEHMAN

Attesting Officer    Commissioner of Patents and Trademarks